(12) United States Patent
Kim et al.

(10) Patent No.: US 11,356,582 B2
(45) Date of Patent: Jun. 7, 2022

(54) CAMERA MODULE WITH GAP MAINTAINING MEMBER

(71) Applicant: SAMSUNG ELECTRO-MECHANICS CO., LTD., Suwon-si (KR)

(72) Inventors: Jang Hun Kim, Suwon-si (KR); Kyoung Soo Son, Suwon-si (KR); Jung Eun Bae, Suwon-si (KR); Jin Gook Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/426,584

(22) Filed: May 30, 2019

(65) Prior Publication Data
US 2020/0021719 A1   Jan. 16, 2020

(30) Foreign Application Priority Data

Jul. 11, 2018 (KR) .................. 10-2018-0080610
Oct. 31, 2018 (KR) .................. 10-2018-0131828

(51) Int. Cl.
*H04N 5/225* (2006.01)
*H01L 27/146* (2006.01)

(52) U.S. Cl.
CPC ..... *H04N 5/2252* (2013.01); *H01L 27/14618* (2013.01); *H04N 5/2253* (2013.01); *H04N 5/2257* (2013.01)

(58) Field of Classification Search
CPC ............ H04N 5/225; H04N 5/335–378; H01L 27/146–14893

USPC .......... 250/208.1, 208.129, 431–44; 257/225–234, 257, 258, 291–294, 257/431–448; 348/294–324
See application file for complete search history.

(56) References Cited

U.S. PATENT DOCUMENTS

| | | | |
|---|---|---|---|
| 9,431,442 B2 | 8/2016 | Vittu | |
| 2006/0202793 A1* | 9/2006 | Akahoshi | H01L 27/14618 338/34 |
| 2007/0047952 A1* | 3/2007 | Kim | H01L 27/14618 396/542 |

(Continued)

FOREIGN PATENT DOCUMENTS

| | | |
|---|---|---|
| CN | 201075551 Y | 6/2008 |
| CN | 105100556 A | 11/2015 |

(Continued)

OTHER PUBLICATIONS

Korean Office Action dated Dec. 9, 2019 in corresponding Korean Patent Application No. 10-2018-0131828 (8 pages in English, 5 pages in Korean).

(Continued)

*Primary Examiner* — Xi Wang
(74) *Attorney, Agent, or Firm* — NSIP Law

(57) ABSTRACT

A camera module includes a substrate, an image sensor disposed on the substrate, a housing to accommodate the image sensor, a filter configured to block an infrared wavelength of light incident on the image sensor and disposed on the housing, a gap maintaining member to maintain a gap between the substrate and the bottom housing, and a sealing member to connect the substrate to the housing and to surround the image sensor.

13 Claims, 7 Drawing Sheets

(56) References Cited

U.S. PATENT DOCUMENTS

| | | | | |
|---|---|---|---|---|
| 2007/0160369 | A1* | 7/2007 | Jane | G03B 17/28 |
| | | | | 396/529 |
| 2009/0147115 | A1* | 6/2009 | Tanida | H04N 5/2253 |
| | | | | 348/294 |
| 2010/0053423 | A1* | 3/2010 | Singh | G03B 19/00 |
| | | | | 348/374 |
| 2011/0130177 | A1* | 6/2011 | Halliday | H04N 5/2257 |
| | | | | 455/575.1 |
| 2012/0141114 | A1* | 6/2012 | Gooi | H04N 5/2252 |
| | | | | 396/529 |
| 2012/0314309 | A1* | 12/2012 | Tatebayashi | G02B 13/003 |
| | | | | 359/819 |
| 2014/0049671 | A1* | 2/2014 | Chen | H04N 5/2257 |
| | | | | 348/294 |
| 2014/0267760 | A1* | 9/2014 | Lee | G03B 11/00 |
| | | | | 348/164 |
| 2016/0191767 | A1 | 6/2016 | Otani et al. | |
| 2016/0241749 | A1* | 8/2016 | Alasimio | H04N 5/2252 |
| 2017/0264799 | A1 | 9/2017 | Wang et al. | |
| 2018/0020131 | A1* | 1/2018 | zhao et al. | H04N 5/2252 |
| 2018/0084161 | A1* | 3/2018 | Lee | G02B 27/0006 |
| 2020/0145560 | A1* | 5/2020 | Han | G03B 17/08 |

FOREIGN PATENT DOCUMENTS

| | | |
|---|---|---|
| CN | 106686283 A | 5/2017 |
| CN | 107734216 A | 2/2018 |
| CN | 107734227 A | 2/2018 |
| JP | 2004-165240 A | 6/2004 |
| JP | 2006-042212 A | 2/2006 |
| KR | 10-0772587 B1 | 11/2007 |
| KR | 10-2009-0037570 A | 4/2009 |
| KR | 10-2010-0032952 A | 3/2010 |
| KR | 10-2015-0039916 A | 4/2015 |
| KR | 10-2016-0046785 A | 4/2016 |

OTHER PUBLICATIONS

Chinese Office Action dated Sep. 10, 2020 issued in counterpart to Chinese Patent Application No. 201910619245.5 (6 pages in English, 8 Pages in Chinese).

Chinese Office Action dated Apr. 16, 2021 in counterpart Chinese Patent Application No. 201910619245.5 (4 pages in English, 7 pages in Chinese).

* cited by examiner

A-A

CAMERA MODULE WITH GAP MAINTAINING MEMBER

CROSS-REFERENCE TO RELATED APPLICATION(S)

This application claims the benefit under 35 USC 119(a) of Korean Patent Application No. 10-2018-0080610 filed on Jul. 11, 2018 and Korean Patent Application No. 10-2018-0131828 filed on Oct. 31, 2018 in the Korean Intellectual Property Office, the entire disclosures of which are incorporated herein by reference for all purposes.

BACKGROUND

1. Field

The following description relates to a camera module easily mounted in a device, having a narrow mounting space, such as a portable terminal.

2. Description of Background

A compact camera module is mounted in a portable terminal such as a wireless phone. Since such a small terminal accommodates various types of devices integrally, a camera module needs to be miniaturized and intensified. However, since a conventional small camera module has a structure in which an image sensor, a passive component, and a wall member for blocking foreign objects are disposed in a horizontal direction of a substrate, it is difficult to reduce a size of a conventional small camera module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a camera module includes a substrate, an image sensor disposed on the substrate, a housing to accommodate the image sensor, a filter configured to block an infrared wavelength of light incident on the image sensor and disposed on the housing, a gap maintaining member to maintain a gap between the substrate and the bottom housing, and a sealing member to connect the substrate to the housing and to surround the image sensor.

The gap maintaining member may be disposed to surround the image sensor.

The gap maintaining member may be disposed to partially surround the image sensor and may include at least one open portion that does not surround the image sensor.

The gap maintaining member may include a reinforcing member that extends outwardly from a body of the gap maintaining member.

The substrate may include an external connection terminal in a region of the substrate in which the sealing member is not exposed.

The camera module may include another housing connected to the housing to accommodate a lens barrel.

In another general aspect, a camera module includes a substrate; an image sensor disposed on the substrate; a passive component disposed on the substrate; a housing to accommodate the image sensor; a filter to block an infrared wavelength of light incident on the image sensor and disposed on the housing; a gap maintaining member to maintain a gap between the substrate and the housing and to spatially isolate a first region, in which the image sensor is disposed, and a second region in which the passive component is disposed; and a sealing member disposed in the second region.

The gap maintaining member may extend from the housing to the substrate.

The gap maintaining member may include a reinforcing member that extends outwardly from a body of the gap maintaining member.

The gap maintaining member may include a portion that is planar with an end portion of the substrate.

The gap maintaining member may be disposed to partially surround the image sensor and may include at least one open location that does not surround the image sensor.

The at least one open location of the gap maintaining member may be adjacent to a region on the substrate in which the passive component is not disposed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
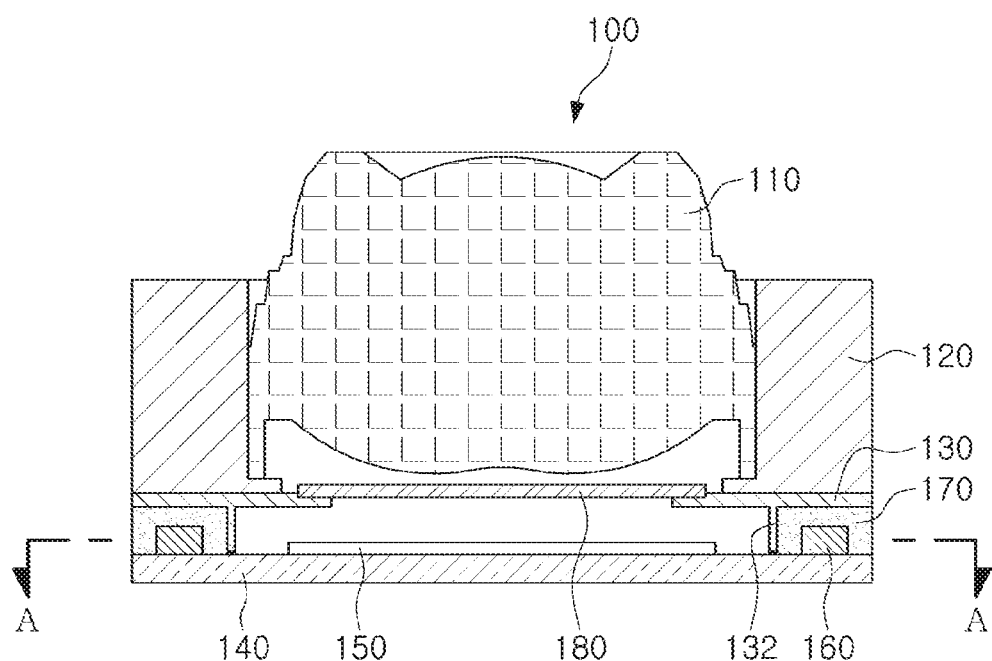
FIG. 1 is a cross-sectional view of a camera module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described as follows with reference to the attached drawings.

Hereinafter, a camera module according to an example will be described with reference to FIG. 1.

A camera module 100 includes a lens barrel 110, housings 120 and 130, a substrate 140, an image sensor 150, and a passive component 160.

The camera module 100 includes a plurality of lenses. For example, the lens barrel 110 may include four or more lenses, each having refractive power. However, the number of lenses accommodated in the lens barrel 110 is not limited to four.

The housings 120 and 130 are configured to accommodate the lens barrel 110. The housings 120 and 130 may include a top housing 120 and a bottom housing 130. For example, the top housing 120 may be provided with a space in which the lens barrel 110 is accommodated. The housings 120 and 130 may include a configuration allowing the lens barrel 110 to be movable. As an example, the top housing 120 may further include a first actuator allowing the lens barrel 110 to be movable in an optical axis direction. As another example, the top housing 120 may further include a second actuator allowing the lens barrel 110 to be movable in a horizontal direction (intersecting the optical axis direction).

The housings 120 and 130 are configured to accommodate the image sensor 150. For example, the bottom housing 130 may be coupled to the substrate 140, on which the image sensor 150 is mounted, to prevent a contact between the image sensor 150 and a foreign object. To this end, the bottom housing 130 further includes a gap maintaining member 132 extending between the image sensor 150 and the passive component 160.

The gap maintaining member 132 is disposed to substantially surround four sides of the image sensor 150. Accordingly, the gap maintaining member 132 may prevent a foreign object, remaining outside the housings 120 and 130, from entering the image sensor 150. The gap maintaining member 132 is configured to significantly reduce a contact area with the substrate 140. As an example, the gap maintaining member 132 is formed to have a processable minimum thickness t. Thus, the substrate 140 may be provided with a sufficient space in which the image sensor 150 and the passive component 160 may be mounted. The gap maintaining member 132 is disposed to spatially separate an upper region of the substrate 140 into a first region, in which the image sensor 150 is disposed, and a second region in which the passive component 160 is disposed. Accordingly, the gap maintaining member 132 may reduce mutual interference, caused by electromagnetic waves, between the image sensor 150 and the passive component 160. The gap maintaining member 132 is disposed as close as possible to the image sensor 150. Such a limitation allows the second region, in which the passive component 160 is disposed, to be easily secured.

The housings 120 and 130 are configured to support a filter 180. For example, the bottom housing 130 includes a support portion for supporting the filter 180.

The substrate 140 includes a configuration connecting the image sensor 150 and the passive component 160 to each other. For example, a printed circuit board (PCB) may be disposed on a surface or an inside of the substrate 140 to connect the image sensor 150 and the passive component 160 to each other.

The image sensor 150 is configured to convert an optical signal. For example, the image sensor 150 may convert an optical signal, incident through lenses of the lens barrel 110, into an electrical signal. The passive component 160 is configured to assist functions of the image sensor 150. For example, the passive component 160 may be used to increase conversion speed of the image sensor 150 or to amplify an electrical signal of the image sensor 150. The passive component 160 is disposed around the image sensor 150. As an example, a plurality of passive components 160 may be mounted on four sides of the image sensor 150 at predetermined intervals.

The camera module 100 includes a configuration for sealing an open space between the bottom housing 130 and the substrate 140. As an example, the camera module 100 further includes a sealing member 170 configured to seal the passive component 160. The sealing member 170 may be filled between the bottom housing 130 and the substrate 140 to protect the passive component from external impact and to improve adhesive force between the bottom housing 130 and the substrate 140. The sealing member 170 may serve to disperse a load applied to the gap maintaining member 132. The sealing member 170 may be formed of an adhesive. For example, the sealing member 170 may be in a cured form of an adhesive applied to the second region of the substrate 140. The above-configured sealing member 170 may tightly couple the substrate 140 and the bottom housing 130 to each other, as described above. The sealing member 170 may serve as a support member configured to bear loads of the housings 120 and 130. Thus, the thickness t of the gap maintaining member 132 and cross-sectional sizes of the housings 120 and 130 may be significantly reduced.

Figure 2:
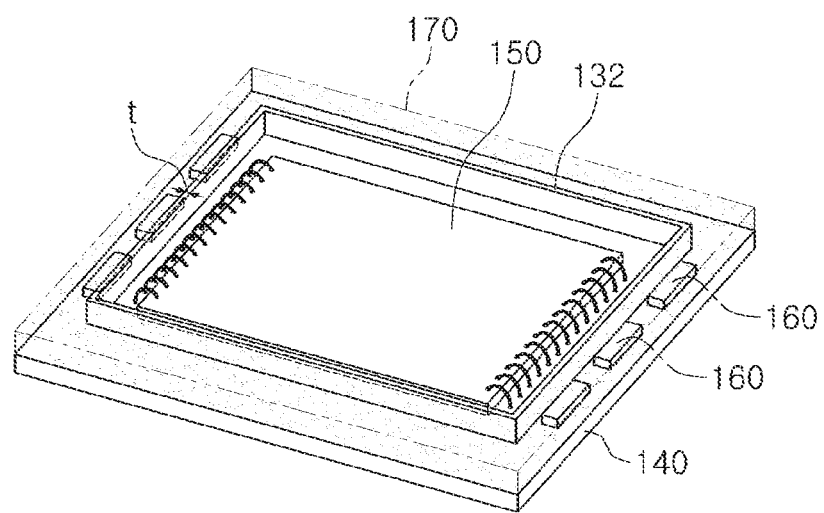
FIG. 2 is a cutaway perspective view taken along line A-A of the camera module illustrated in FIG. 1.

Hereinafter, a cross-sectional shape of the camera module 100, taken along line A-A, will be described below with reference to FIG. 2.

The camera module 100 includes configurations for supporting and sealing four sides of the image sensor 150, as described with reference to FIG. 2. For example, the gap maintaining member 132 of the bottom housing 130 is configured to fully surround the four sides of the image sensor 150, and the sealing member 170 is configured to seal an entire region, in which the passive component 160 is mounted, from the gap maintaining member 132.

The camera module 100 may reduce contamination of the image sensor, caused by a foreign object, because a surrounding space of the image sensor 150 is sealed by the gap maintaining member 132 and the sealing member 170.

The gap maintaining member 132 and the sealing member 170 may improve coupling reliability between the bottom housing 130 and the substrate 140. Additionally, since the bottom housing 130 and the substrate 140 are three-dimensionally coupled by the gap maintaining member 132 and the sealing member 170, adhesive force between the bottom housing 130 and the substrate 140 may be improved.

Figure 3:
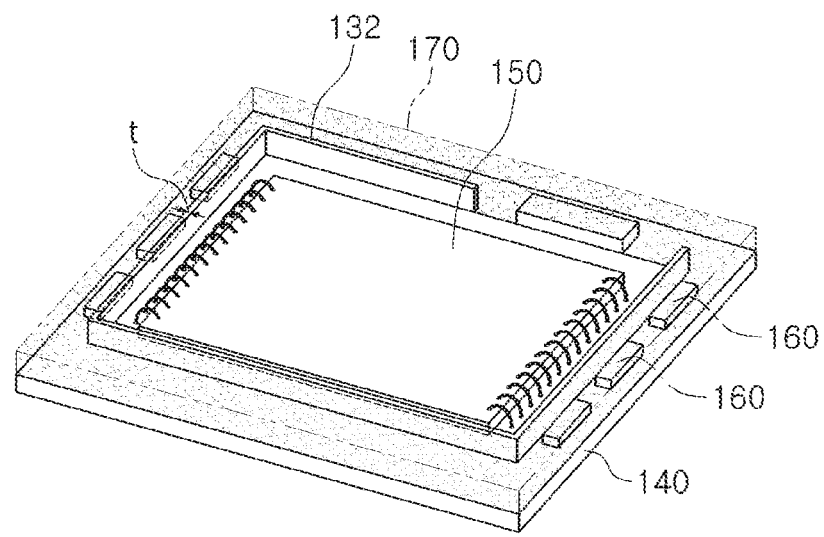
FIG. 3 is a cutaway perspective view taken along line A-A according to a modified example of the camera module illustrated in FIG. 1.
Figure 4:
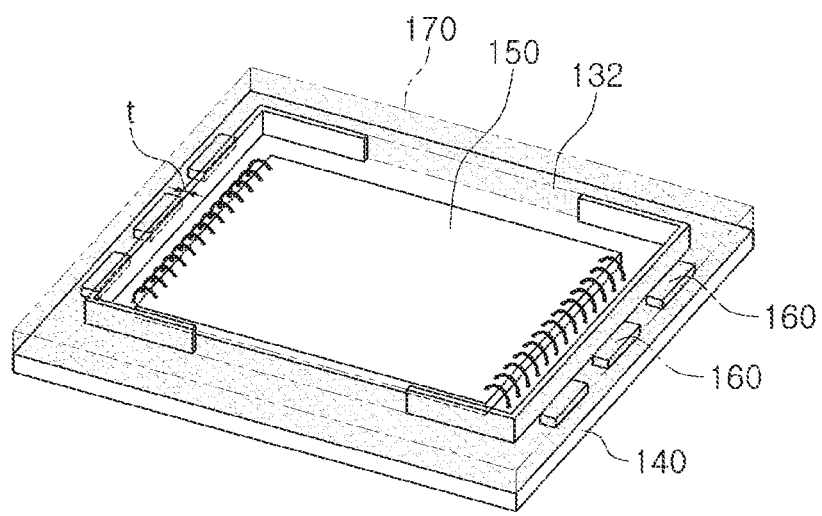
FIG. 4 is a cutaway perspective view taken along line A-A according to another modified example of the camera module illustrated in FIG. 1.

Hereinafter, cross-sectional shapes depending on modified examples of a camera module will be described with reference to FIGS. 3 and 4.

A camera module 100 according to a modified example includes a gap maintaining member 132 having a shape different from the above-described shape. As illustrated in FIG. 3, a gap maintaining member 132 may have an open portion. Alternatively, as illustrated in FIG. 4, a gap maintaining member 132 may have a plurality of open portions. An open location of the gap maintaining member 132 may be adjacent to a region in which a passive component 160 is not mounted. However, the open location of the gap maintaining member 132 is not limited to locations illustrated in FIGS. 3 and 4. As another example, the gap maintaining member 132 may be configured in such a manner that the passive component 160 is opened in an adjacent region.

According to such modified examples, an area, occupied by the gap maintaining member 132 on a substrate 140, may be significantly reduced to secure a large mounting area of an electronic component including the passive component 160.

Figure 5:
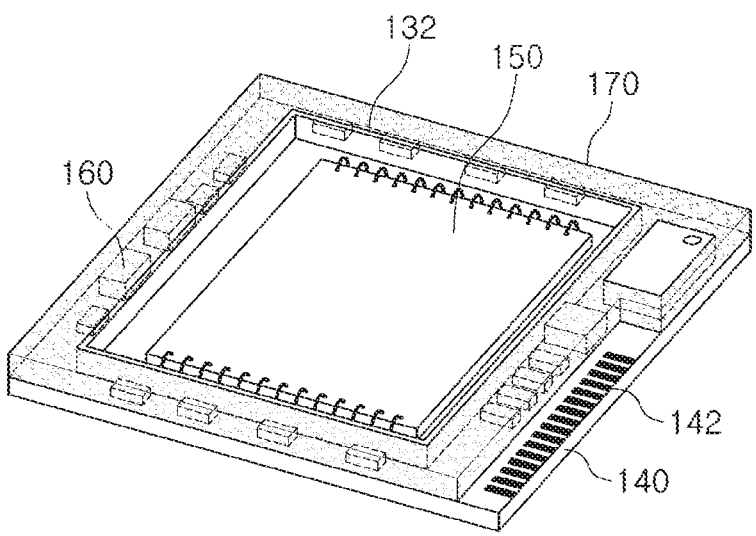
FIG. 5 is a cutaway perspective view taken along line A-A according to another modified example of the camera module illustrated in FIG. 1.

Hereinafter, a cross-sectional shape depending on a modified example of a camera module will be described with reference to FIG. 5.

A camera module 100 according to the present example includes a sealing member 170 having a shape different from the above-described shape. As illustrated in FIG. 5, the sealing member 170 is not disposed in a certain portion of a substrate 140. As an example, the sealing member 170 may not be disposed in a region of the substrate 140 in which an internal connection terminal or an external connection terminal 142 is disposed. A type of the internal connection terminal may be a terminal connecting an actuator for a lens barrel 110 and a substrate to each other, and a type of the external connection terminal 142 may be a terminal connecting a camera module and an external device to each other.

Figure 6:
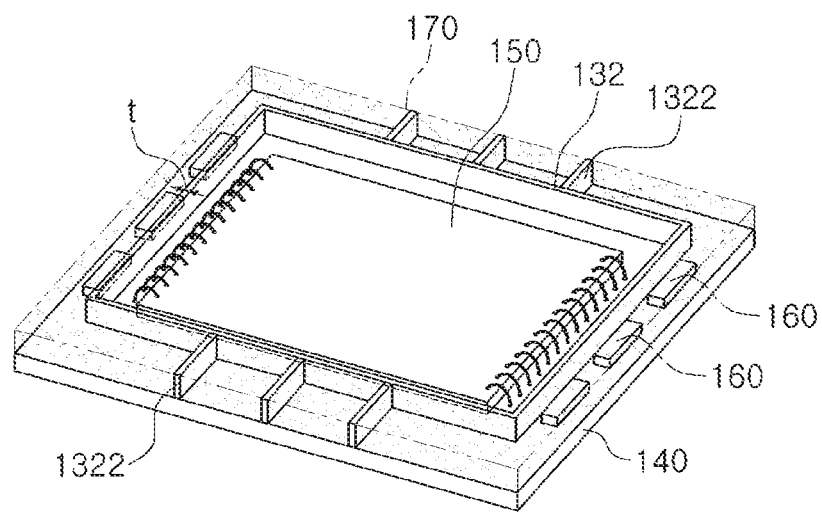
FIG. 6 is a cutaway perspective view taken along line A-A according to another modified example of the camera module illustrated in FIG. 1.

Hereinafter, a cross-sectional shape depending on another modified example of a camera module will be described with reference to FIG. 6.

A camera module 100 according to the present modified example includes a gap maintaining member 132 having a shape different from the above-described shape. The gap maintaining member 132 includes a reinforcing member 1322 extending outwardly from a body on the substrate 140.

The reinforcing member 1322 may improve support strength of the gap maintaining member 132. For example, the reinforcing member 1322 may reduce breakage of the gap maintaining member 132, having a small thickness, while assembling the camera module 100. Moreover, the reinforcing member 1322 may improve adhesive force between the substrate 140 and a bottom housing 130. Additionally, the reinforcing member 1322 may increase a contact area between the gap maintaining member 132 and the substrate 140 and a contact area between the gap maintaining member 132 and the sealing member 170 to improve adhesive force between the substrate 140 and the bottom housing 130.

Figure 7:
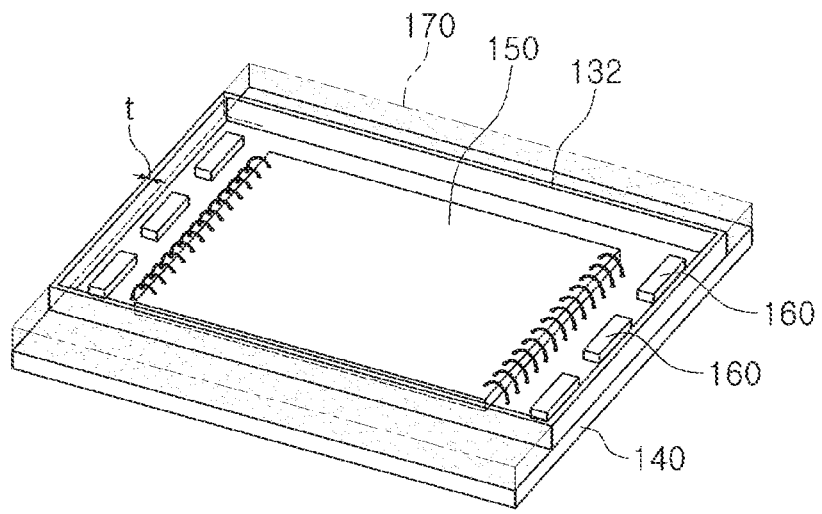
FIG. 7 is a cutaway perspective view taken along line A-A according to another modified example of the camera module illustrated in FIG. 1.
Figure 8:
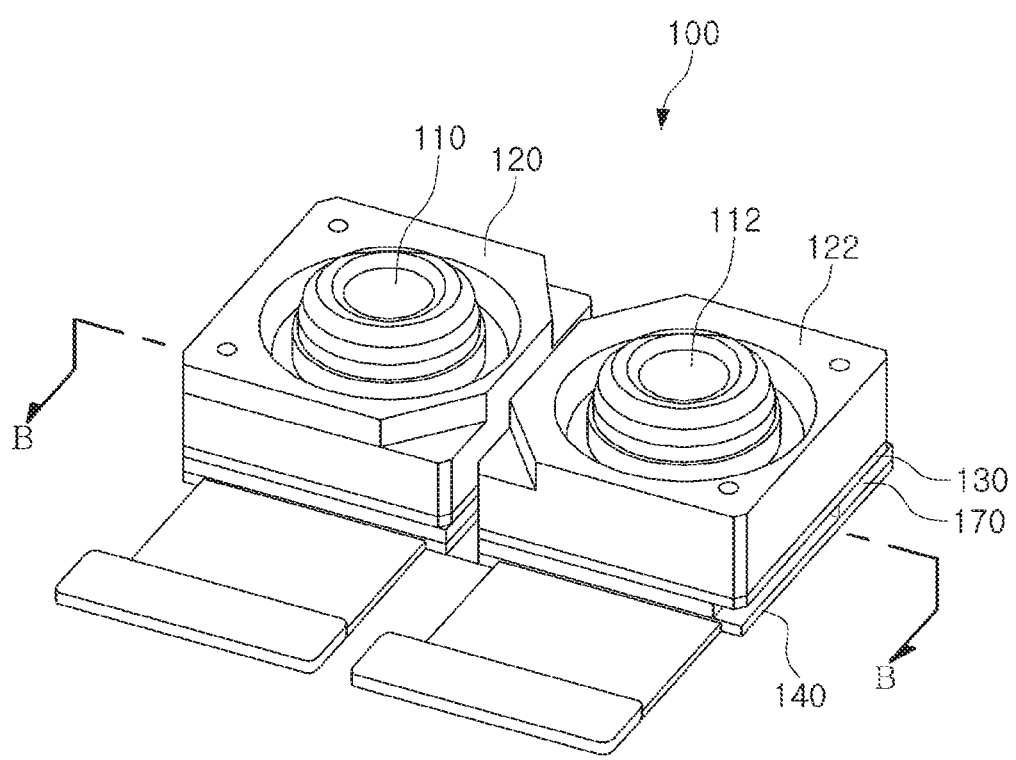
FIG. 8 is a cross-sectional view of a camera module according to another example.
Figure 9:
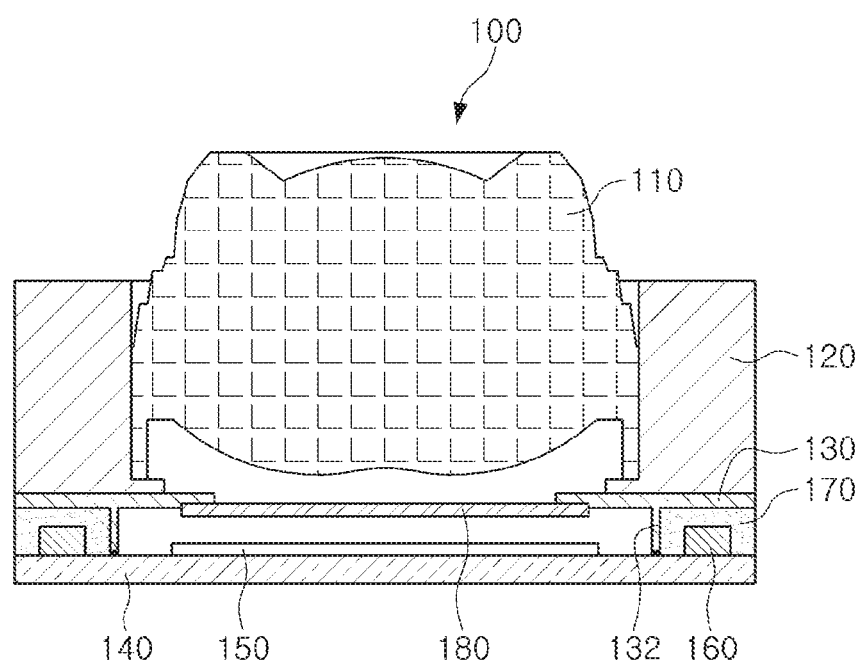
FIG. 9 is a perspective view of the camera module according to another example.

Hereinafter, a cross-sectional shape depending on another modified example of a camera module will be described with reference to FIG. 7.

A camera module 100 includes a gap maintaining member 132 having a shape different from the above-described shape. The gap maintaining member 132 according to the present example may be disposed to surround both an image sensor 150 and a passive component 160. A portion of the gap maintaining member 132 may be disposed to form a plane continuous with an end portion of a substrate 140. Additionally, a portion of the gap maintaining member 132 may not be sealed by a sealing member 170 and may be exposed outwardly. The camera module 100 according to the present example may be appropriate for a case in which an integration density of an image sensor 150 and a passive component 160 is high.

Hereinafter, a camera module according to another example will be described with reference to FIGS. 8 through 11.

A camera module 100 according to the present example includes a bottom housing 130 having a shape different from the above-described shape. For example, the bottom housing 130 may be configured to be bonded to a substrate 140 after being bonded to a top housing 120. Thus, a filter 180 may be attached to a lower side of the top housing 130.

A camera module 100 includes a plurality of optical systems. For example, the camera module 100 includes a first lens barrel 110 and a second lens barrel 112. The first lens barrel 110 and the second lens barrel 112 may accommodate optical systems, having different optical characteristics to each other, respectively. However, the first lens barrel 110 and the second lens barrel 112 may accommodate the same optical system, as necessary. The camera module 100 includes the same number of top housings 120 and 122, accommodating of the respective lens barrels 110 and 112. The camera module 100 includes a single bottom housing 130 or a plurality of bottom housings 130 coupled to the top housings 120 and 122.

Figure 10:
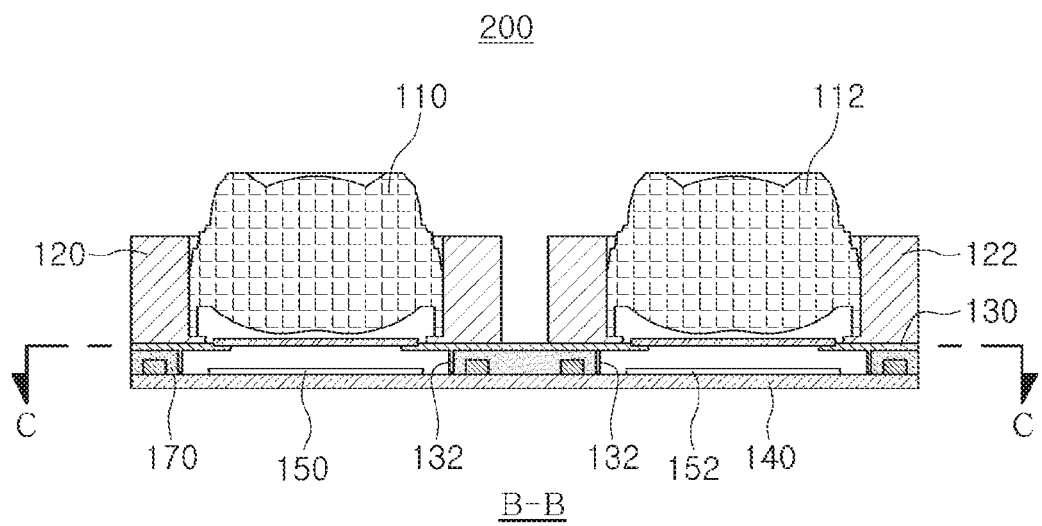
FIG. 10 is a cross-sectional view taken along line B-B of the camera module illustrated in FIG. 8.
Figure 11:
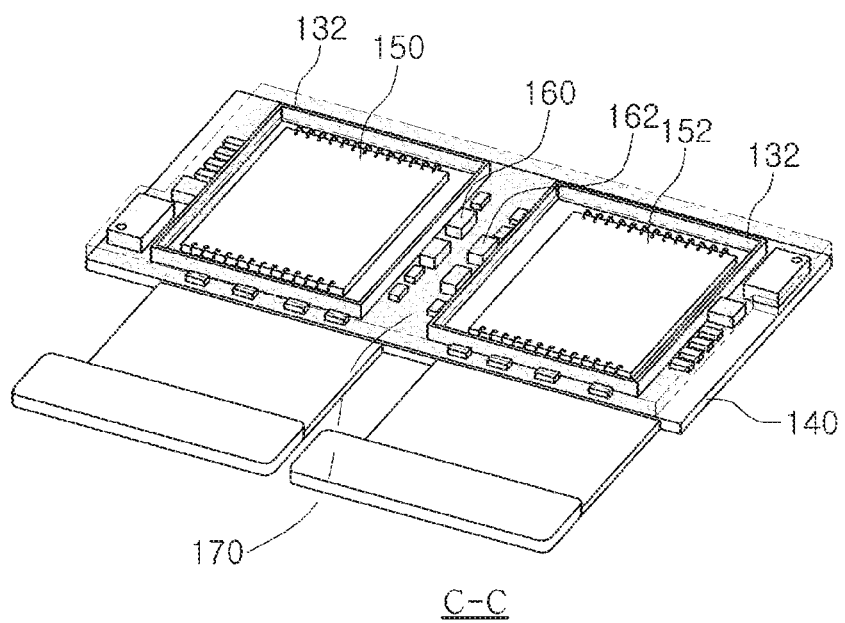
FIG. 11 is a cross-sectional view taken along line C-C of the camera module illustrated in FIG. 10.

The bottom housing 130 includes a gap maintaining member 132 configured to independently isolate a plurality of image sensors 150 and 152, as illustrated in FIGS. 10 and 11. A plurality of passive components 160 and 162 are mounted outwardly of the gap maintaining member 132, as illustrated in FIG. 11. Since a significantly large space is formed between the image sensor 150 and the image sensor 152, as illustrated in FIG. 11, a large number of passive components 160 and 162 may be integrated in a corresponding space to reduce an overall size of the substrate 140. An external side of the gap maintaining member 132 may be filled with a sealing member 170, formed of epoxy, to seal the passive components 160 and 162. The sealing member 170 may also be used to enhance adhesive force between the substrate 140 and the bottom housing 130.

As described above, a camera module according to the examples may be miniaturized.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A camera module comprising:
a substrate;
an image sensor disposed on the substrate;
a housing configured to accommodate the image sensor;
a filter configured to block an infrared wavelength of light incident on the image sensor and disposed on the housing;
a gap maintaining member connected to an upper surface of the substrate, and configured to maintain a gap between the substrate and the housing; and
a sealing member in contact with the gap maintaining member and configured to connect the substrate to the housing and to surround the image sensor,
wherein the gap maintaining member comprises a reinforcing member that extends outwardly from a body of the gap maintaining member.

2. The camera module of claim 1, wherein the gap maintaining member is disposed to surround the image sensor.

3. The camera module of claim 1, wherein the gap maintaining member is disposed to partially surround the image sensor and comprises at least one open portion that does not surround the image sensor.

4. The camera module of claim 1, wherein the substrate comprises an external connection terminal in a region of the substrate in which the sealing member is not exposed.

5. The camera module of claim 1, further comprising:
another housing connected to the housing and configured to accommodate a lens barrel.

6. The camera module of claim 1, wherein the gap maintaining member is disposed to separate the substrate into a first region in which the image sensor is disposed, and a second region in which a passive component is disposed.

7. A camera module comprising:
a substrate;
an image sensor disposed on the substrate;
a passive component disposed on the substrate;
a housing configured to accommodate the image sensor;
a filter configured to block an infrared wavelength of light incident on the image sensor and disposed on the housing;
a gap maintaining member extending between the passive component and the image sensor, and configured to maintain a gap between the substrate and the housing and to spatially isolate a first region, in which the image sensor is disposed, and a second region in which the passive component is disposed; and
a sealing member disposed in the second region, and configured to seal the passive component.

8. The camera module of claim 7, wherein the gap maintaining member extends from the housing to the substrate.

9. The camera module of claim 7, wherein the gap maintaining member comprises a reinforcing member that extends outwardly from a body of the gap maintaining member.

10. The camera module of claim 7, wherein the gap maintaining member comprises a portion that is planar with an end portion of the substrate.

11. The camera module of claim 7, wherein the gap maintaining member is disposed to partially surround the image sensor and comprises at least one open location that does not surround the image sensor.

12. The camera module of claim 11, wherein the at least one open location of the gap maintaining member is adjacent to a region on the substrate in which the passive component is not disposed.

13. A camera module comprising:
- a substrate;
- an image sensor disposed on the substrate;
- a housing configured to accommodate the image sensor;
- a filter configured to block an infrared wavelength of light incident on the image sensor and disposed on the housing;
- a gap maintaining member configured to maintain a gap between the substrate and the housing; and
- a sealing member configured to connect the substrate to the housing and to surround the image sensor,
- wherein the gap maintaining member is disposed to separate the substrate into a first region in which the image sensor is disposed, and a second region in which a passive component and the sealing member are disposed, and
- wherein the sealing member is configured to seal the passive component.

\* \* \* \* \*